US009356617B2

(12) United States Patent
Opris et al.

(10) Patent No.: US 9,356,617 B2
(45) Date of Patent: May 31, 2016

(54) UNIFORM DISTRIBUTION DITHERING IN SIGMA-DELTA A/D CONVERTERS

(71) Applicant: Fairchild Semiconductor Corporation, San Jose, CA (US)

(72) Inventors: Ion Opris, San Jose, CA (US); Justin Seng, San Jose, CA (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/661,388

(22) Filed: Mar. 18, 2015

(65) Prior Publication Data

US 2015/0270847 A1   Sep. 24, 2015

Related U.S. Application Data

(60) Provisional application No. 61/955,102, filed on Mar. 18, 2014.

(51) Int. Cl.
*H03M 3/00*   (2006.01)

(52) U.S. Cl.
CPC .............. *H03M 3/332* (2013.01); *H03M 3/458* (2013.01)

(58) Field of Classification Search
CPC ......... H03M 3/02; H03M 3/43; H03M 3/494; H03M 3/34; H03M 3/344; H03M 3/458; H03M 3/364; H03M 3/452; H03M 3/454; H03M 3/372; H03M 1/201; H03M 1/0631; H03M 1/0629; H03M 3/33; H05B 33/083; H05B 33/0818; H05B 33/0827

USPC .................. 341/143, 166, 155, 144; 375/247; 315/161

See application file for complete search history.

(56) References Cited

U.S. PATENT DOCUMENTS

| | | | | |
|---|---|---|---|---|
| 5,191,331 A * | 3/1993 | Karema | ............... | H03M 7/3008 341/131 |
| 6,049,299 A | 4/2000 | Lunacek et al. | | |
| 6,825,784 B1 | 11/2004 | Zhang | | |
| 6,975,255 B1 | 12/2005 | Zhang | | |
| 2003/0095012 A1* | 5/2003 | Chethik | ................ | H04L 27/361 332/103 |
| 2004/0204875 A1* | 10/2004 | Kopken | ................ | G01R 15/185 702/64 |
| 2007/0201171 A1* | 8/2007 | Kanekawa | .......... | H03M 1/1004 361/42 |
| 2010/0085230 A1* | 4/2010 | Son | ........................ | H03M 3/344 341/155 |
| 2010/0117730 A1* | 5/2010 | Kawai | .................... | H03F 3/2173 330/251 |
| 2010/0231132 A1* | 9/2010 | Logiudice | .......... | H05B 33/0818 315/161 |

* cited by examiner

*Primary Examiner* — Lam T Mai
(74) *Attorney, Agent, or Firm* — Schwegman Lundberg & Woessner, P.A.

(57) ABSTRACT

Apparatus and methods for analog-to-digital converters are provided. In an example, a sigma-delta analog-to-digital converter (ADC) can include a modulator configured to receive an analog signal and a decimation filter configured to provide a digital representation of the analog signal using an output of the modulator. In certain examples, the modulator can includes an integrator and a comparator od quantizer coupled to an output of the integrator. The comparator, in certain examples, can be configured to receive a second signal from the output of the integrator and to receive a plurality of dither signals, the dither signals can be configured to prevent limit cycles of the sigma-delta ADC.

18 Claims, 3 Drawing Sheets

UNIFORM DISTRIBUTION DITHERING IN SIGMA-DELTA A/D CONVERTERS

PRIORITY AND RELATED APPLICATIONS

This application claims the benefit of priority to U.S. Provisional Patent Application Ser. No. 61/955,102, filed on Mar. 18, 2014, which is incorporated by reference herein in its entirety.

BACKGROUND

Sigma-delta converters can suffer from limit cycles that can result in higher noise and possible dead-zones in their transfer characteristics. Low order sigma-delta converters, and especially first order converters, are prone to exhibit very large limit cycles, although these limit cycles are possible for any converter order. In certain situations, a limit cycle can be characterized as a tonal output even though the input is steady. It is not unusual that such tones can be produced at multiple input values throughout the input range of a converter. In certain existing analog systems, adding an analog dither signal to the input of an integrator of a sigma-delta comparator has resulted in elimination of cycle events of the comparator.

OVERVIEW

Apparatus and methods for analog-to-digital converters are provided. In an example, a sigma-delta analog-to-digital converter (ADC) can include a modulator configured to receive an analog signal and a decimation filter configured to provide a digital representation of the analog signal using an output of the modulator. In certain examples, the modulator can includes an integrator and a comparator od quantizer coupled to an output of the integrator. The comparator, in certain examples, can be configured to receive a second signal from the output of the integrator and to receive a plurality of dither signals, the dither signals can be configured to prevent limit cycles of the sigma-delta ADC.

This overview is intended to provide a partial summary of the subject matter of the present patent application. It is not intended to provide an exclusive or exhaustive explanation of the invention. The detailed description is included to provide further information about the present patent application.

DETAILED DESCRIPTION

In A/D converters, dithering can be used by adding a random signal (noise) at the input or adding a pseudo-random offset at the comparator/quantizer. The first dithering method has a limited use, since the input dithering adds to the noise floor and is typically larger than the possible limit cycle. The second method is more widely used and has the advantage that the pseudo-random noise introduced at the quantizer input is shaped by the converter noise transfer function. The pseudo-random signal is generated by a 1-bit digital shift register with linear feedback and can be generated using a maximum length modulo 2 polynomial, for example. However, high noise can occur for certain input levels because comparator dithering with a binary signal (2 levels) does not eliminate effectively all the limit cycles and significant dead zones.

The present inventors have recognized, among other things, a dithering method that is more effective in eliminating the limit cycles in sigma-delta converters. In certain examples, an example dithering method can use multiple levels of dithering at the comparator input, with a fairly uniform distribution. It has been shown, both by analysis and behavior simulations, that such a dithering method is much more effective in eliminating the limit cycles. For clarity, the examples below are shown for a first order sigma-delta modulator, however, the same techniques can be applied to higher-order systems that include multiple integrators, multiple loops, cascaded architectures, etc.

Figure 1:
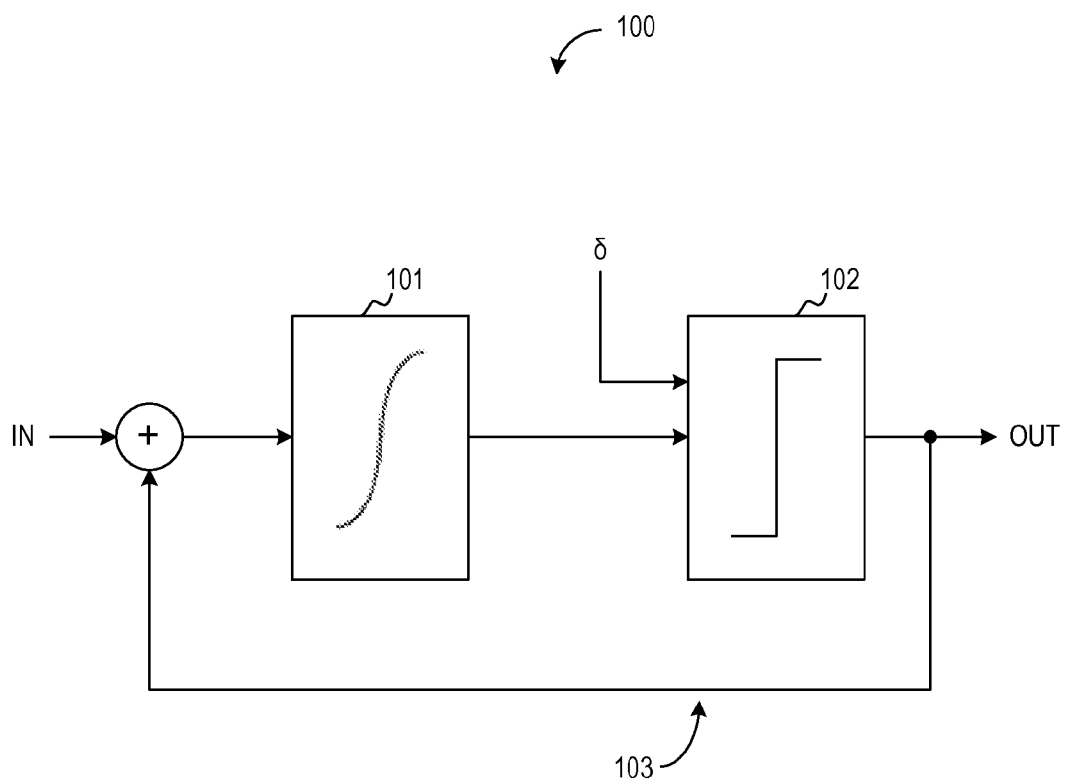
FIG. 1 illustrates generally an example sigma-delta analog-to-digital converter (ADC).

FIG. 1 illustrates generally an example sigma-delta analog-to-digital converter (ADC) 100. The sigma-delta ADC 100 can include an integrator 101, a comparator or quantizer 102 and a feedback circuit 103, or feedback path. The sigma-delta ADC 100 can receive an analog signal (IN) and can provide a serial output digital value representation (OUT) of an amplitude of the analog signal (IN). In some examples, an output signal (OUT) of the sigma-delta ADC 100 can include a pulse train indicative of an amplitude or magnitude of an input analog signal (IN). In certain examples, the integrator 101 can receive the analog signal (IN) and provide an integrated signal to the quantizer 102. The quantizer 102 can compare the integrated signal to a threshold and can provide an output state change when the integrated signal level crosses the threshold. In certain examples, the feedback circuit 103 can reset the integrator 101 upon a change of the quantizer 102 output. In certain examples, the quantizer 102 can receive multi-bit dither information (6) to eliminate limit cycles and dead zones of the sigma-delta ADC 100. In some examples, the sigma-delta ADC 100 can be used to sample charge from a micro-electromechanical system (MEMS) sensor such as a MEMS accelerometer or a MEMS gyroscope, for example. In certain examples, a signal generator can be associated with the sigma-delta ADC. The signal generator can be used to provide a plurality of discreet dither signals ($\delta$) to the input stage of quantizer 102 to prevent, reduce or eliminate limit cycles of the sigma-delta ADC 100. In certain examples, the sigma-delta ADC 100 can include a decimation filter that can receive the bit stream (OUT) from the quantizer 102 and can provide a multi-bit digital representation of the analog signal (IN). In certain examples, the integrator 101 and the quantizer 102, or comparator, can be referred to as a modulator of the sigma-delta ADC 100.

Figure 2:
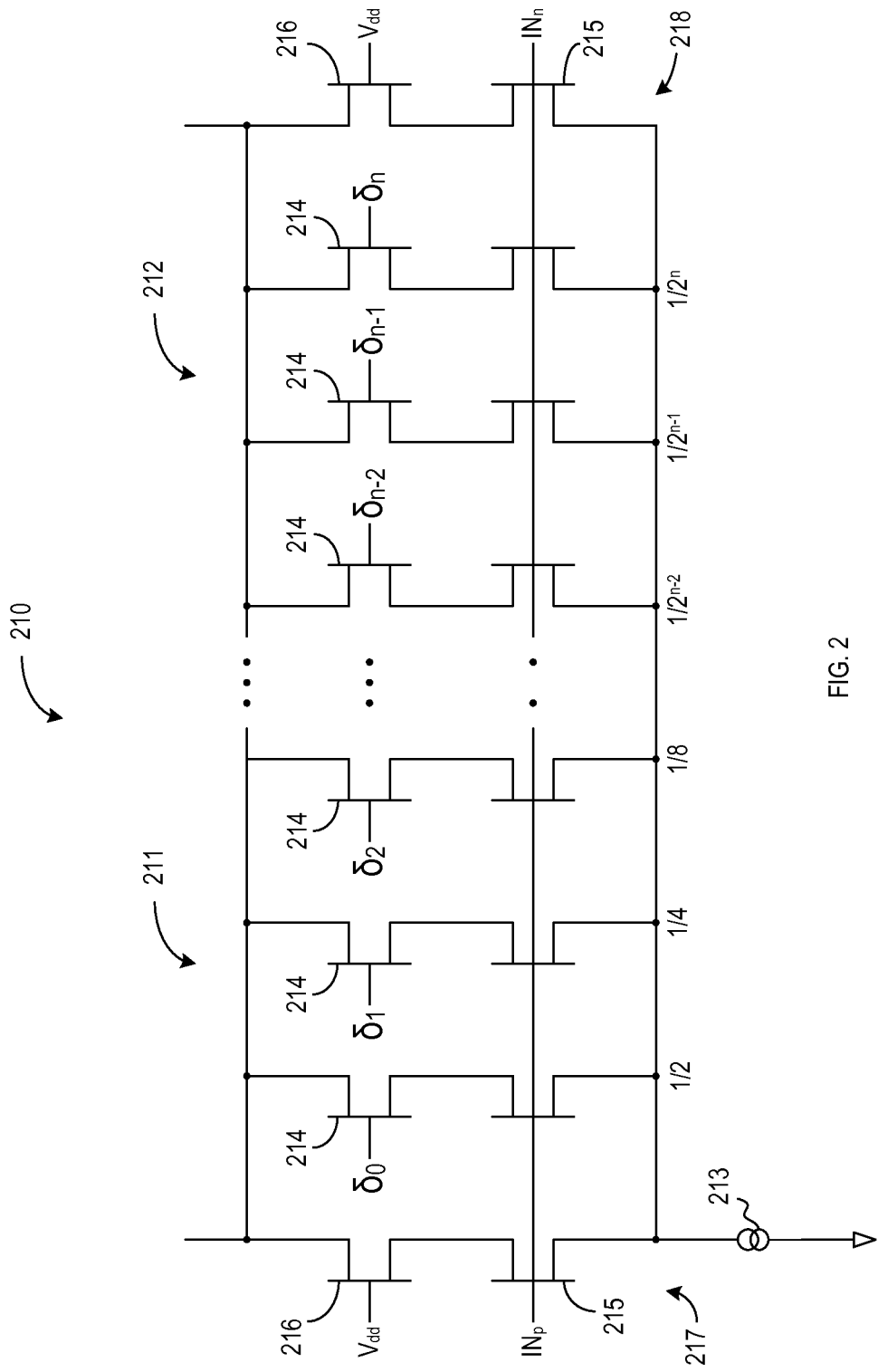
FIG. 2 illustrates generally an example input stage 210 of a differential quantizer.

FIG. 2 illustrates generally an example input stage 210 of a differential quantizer such as the quantizer 102 of FIG. 1. In certain examples, the input stage 210 can include a positive input circuit 211, and a negative input circuit 212 coupled to a current source 213. In certain examples, the input stage 210 can include a plurality of transistors or transistor circuits arranged in parallel to receive a portion of the integrated input signal ($IN_n$, $IN_p$) and a plurality of dither signals ($\delta_i$). In certain examples, the discrete dither signals ($\delta_i$) can offset one or both of the positive input circuit 211 and the negative input circuit 212. In certain examples, each parallel branch of the transistor circuit can include two transistors coupled in series. In some examples, a first branch 217, 218 of an input circuit 211, 212 can include a first transistor 215 to receive the integrated input signal ($IN_n$, $IN_p$) and a second transistor 216 that in certain examples can be used to enable the input circuit 21, 212. In some examples, branches of an the input circuit 211, 212 coupled in parallel to the first branch 217, 218 can include a first transistor to receive the integrated input signal ($IN_n$, $IN_p$) and a second transistor to receive a dither signal ($\delta_i$). In certain examples, each dither signal ($\delta_i$) can provide a substantially equal offset to the corresponding input circuit 211, 212. In certain examples, each dither signal ($\delta_i$) of the dither signals can be weighted with respect to each other dither signal. Such weighting can be achieved by using correspondingly sized transistors 214. In certain examples, as shown, the discrete dither signals ($\delta_i$) can be binary weighted and scaled in width in powers of 2. The multiple-bit dither arrangement as shown in FIG. 2 can allow an analog-type noise signal to be imposed on the comparator input. In certain examples, the weighted dither signals can be more evenly distributed between the corresponding input signals. As shown in FIG. 2, the positive input signal circuit 211 will receive significantly more dither energy than the negative input signal circuit 212 and can result in an offset of the input signal. More even distribution of the weighted dither signals between the input circuits 211, 212 can reduce the potential for a dither-induced offset. As an example, the negative input signal circuit 212 can have a first transistor for providing a first dither signal at a 1/1 ratio and the positive input signal circuit can have a second transistor for providing a second dither signal at a 1/2 ratio, a third transistor for providing a third dither signal at a 1/4 ration and a fourth transistor for providing a fourth dither signal at a 1/8 ratio. As discussed below, the generation of the digital dither signals can be much more efficient in terms of cost, circuit space, and performance compared to an analog dither generation scheme.

Figure 3:
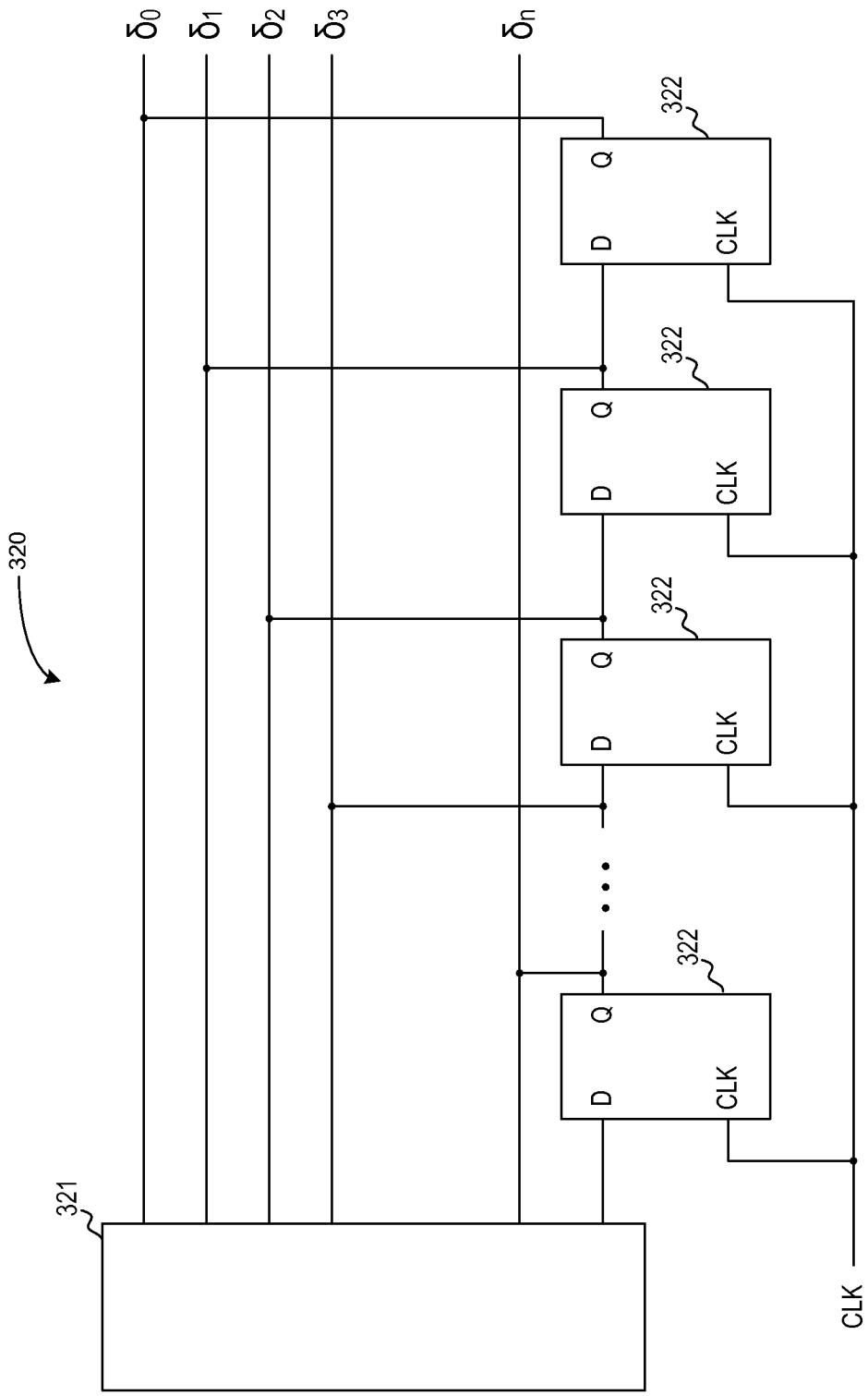
FIG. 3 illustrates generally an example dither signal generator for generating the digital dither signal.

FIG. 3 illustrates generally an example dither signal generator 320 for generating the digital dither signal. In certain examples, the dither signal generator 320 can include a controller 321 and a series of delay elements such as flip-flops 322. In certain examples, the controller 321 can employ pseudo-random number generation logic to provide an input logic level to the series of flip-flops 322. A clock signal (CLK) can trigger the flip-flops 322 and propagate a single bit or bit pattern through the series-coupled flip-flops 322. In certain examples, the output of two or more flip-flops 322 can be received by the input stage of a quantizer (e.g., FIG. 1, item 102) of a sigma-delta ADC. In certain examples, the controller 321 of the dither signal generator 320 can modulate an initial flip-flop input such that the total dither signal ($\delta$) has a uniform amplitude distribution. In certain examples, the controller 321 can receive as feedback one or more outputs of the flip-flops 322 and can use primitive polynomials or modulo 2 arithmetic with the feedback to provide pseudo-random dither signals ($\delta_0, \delta_1, \delta_2, \delta_3, \ldots, \delta_n$). In certain examples, the generation and application of multiple dither signals to the input of the quantizer can simulate an analog noise signal applied to the input of the sigma-delta ADC. However, digital generation of the dither signal is much more efficient in terms of fabrication, circuit space, tuning and processing power.

Additional Notes and Examples

In Example 1, a sigma-delta analog-to-digital converter (ADC) can include a modulator configured to receive an analog signal, a decimation filter configured to provide a digital representation of the analog signal using an output of the modulator. The modulator can include an integrator and a comparator coupled to an output of the integrator, wherein the comparator is configured to receive an second signal from the output of the integrator and to receive a plurality of dither signals, the dither signals configured to prevent limit cycles of the sigma-delta ADC.

In Example 2, the sigma-delta ADC of Example 1 optionally includes a signal generator configured to provide the dither signals.

In Example 3, the signal generator of anyone or more of Examples 1-2 optionally includes a pseudo-random signal generator.

In Example 4, an input circuit of the comparator of any one or more of Examples 1-3 optionally includes a current source, and a transistor circuit coupled in series with the current source, wherein the transistor circuit includes a plurality of transistors coupled in parallel, and wherein a control terminal of a first transistor of the plurality of transistors is configured to receive the second signal.

In Example 5, a control terminal of each transistor of a second plurality of transistors of any one or more of Examples 1-4 optionally is configured to receive one of the plurality of dither signals, wherein the plurality of transistors of the transistor circuit includes the second plurality of transistors.

In Example 6, the second plurality of transistors of any one or more of Examples 1-5 optionally are sized in a weighted fashion with respect to each other.

In Example 7, wherein each transistor of the second plurality of transistors of any one or more of Examples 1-6 optionally is sized in a binary-weighted fashion with respect to each other transistor of the second plurality of transistors.

In Example 8, a modulator for an analog-to-digital converter (ADC) can include an integrator configured to receive a first signal, and a comparator configured to receive a second signal from the output of the integrator, to receive a plurality of dither signals, the dither signals configured to prevent limit cycles of the ADC, and to provide a pulse train indicative of an analog level of the first signal.

In Example 9, the modulator of any one or more of Examples 1-8 optionally includes a feedback path from the output of the comparator to the input of the integrator.

In Example 10, the modulator of any one or more of Examples 1-9 optionally includes a dither generator configured to receive a clock signal and to provide the plurality of dither signals.

In Example 11, the dither generator of any one or more of Examples 1-10 optionally includes a controller and a plurality of series coupled delay elements.

In Example 12, the plurality of series coupled delay elements of any one or more of Examples 1-11 optionally includes a plurality of series coupled flip-flops.

In Example 13, wherein a first output of a first flip-flop of the plurality of series coupled flip-flops of anyone or more of Examples 1-12 optionally is configured to provide a first dither signal of the plurality of dither signals.

In Example 14, a method can include receiving an analog signal at an integrator of a modulator of a sigma-delta analog-to-digital converter (ADC), receiving an output of the integrator at a comparator of the sigma-delta ADC, receiving a plurality of dither signals at an input stage of the comparator, the dither signals configured to prevent limit cycles of the sigma-delta ADC, and providing a pulse train indicative of an analog level of the analog signal.

In Example 15, the method of any one or more of Examples 1-14 optionally includes receiving the pulse train at a decimation filter, and providing a digital, multi-bit representation of the analog signal using an output of the decimation filter and the pulse train.

In Example 16, the method of any one or more of Examples 1-15 optionally includes resetting the integrator using an output of the comparator.

In Example 17, the method of any one or more of Examples 1-16 optionally includes generating the plurality of dither signals having a uniform amplitude distribution.

In Example 18, the generating the plurality of dither signals of any one or more of Examples 1-17 optionally includes generating a single bit pattern having the uniform amplitude distribution at a controller of a dither generator, and propagating the single bit pattern using a plurality of series-coupled flip-flops, wherein an output of a first flip-flop of the plurality series-coupled flip-flops is configured to provide a first dither signal of the plurality of dither signals.

In Example 19, the method of anyone or more of Examples 1-18 optionally includes receiving the plurality of dither signals at the controller.

Example 20 can include, or can optionally be combined with any portion or combination of any portions of any one or more of Examples 1 through 19 to include, subject matter that can include means for performing any one or more of the functions of Examples 1 through 19, or a machine-readable medium including instructions that, when performed by a machine, cause the machine to perform any one or more of the functions of Examples 1 through 19.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A sigma-delta analog-to-digital converter (ADC) comprising:
   a modulator configured to receive an analog signal;
   a decimation filter configured to provide a digital representation of the analog signal using an output of the modulator;
   wherein the modulator includes:
      an integrator; and
      a comparator coupled to an output of the integrator;
   wherein the comparator is configured to receive an second signal from the output of the integrator and to receive a plurality of dither signals, the dither signals configured to prevent limit cycles of the sigma-delta ADC; and
   wherein an input circuit of the comparator includes:
      a current source; and
      a transistor circuit coupled in series with the current source;
      wherein the transistor circuit includes a plurality of transistors coupled in parallel; and
      wherein a control terminal of a first transistor of the plurality of transistors is configured to receive the second signal.

2. The sigma-delta ADC of claim 1, including a signal generator configured to provide the dither signals.

3. The sigma-delta ADC of claim 2, the signal generator includes a pseudo-random signal generator.

4. The sigma-delta ADC of claim 1, wherein a control terminal of each transistor of a second plurality of transistors is configured to receive one of the plurality of dither signals, wherein the plurality of transistors of the transistor circuit includes the second plurality of transistors.

5. The sigma-delta ADC of claim 4, wherein the second plurality of transistors are sized in a weighted fashion with respect to each other.

6. The sigma-delta ADC of claim 4, wherein each transistor of the second plurality of transistors is sized in a binary-weighted fashion with respect to each other transistor of the second plurality of transistors.

7. A modulator for an analog-to-digital converter (ADC), the modulator comprising:
    an integrator configured to receive a first signal; and
    a comparator configured to receive a second signal from the output of the integrator, to receive a plurality of dither signals; the dither signals configured to prevent limit cycles of the ADC, and to provide a pulse train indicative of an analog level of the first signal.

8. The modulator of claim 7, including a feedback path from the output of the comparator to the input of the integrator.

9. The modulator of claim 7, including a dither generator configured to receive a clock signal and to provide the plurality of dither signals.

10. The modulator of claim 9, wherein the dither generator includes a controller and a plurality of series coupled delay elements.

11. The modulator of claim 10, wherein the plurality of series coupled delay elements includes a plurality of series coupled flip-flops.

12. The modulator of claim 11, wherein a first output of a first flip-flop of the plurality of series coupled flip-flops is configured to provide a first dither signal of the plurality of dither signals.

13. A method comprising:
    receiving an analog signal at an integrator of a modulator of a sigma-delta analog-to-digital converter (ADC);
    receiving an output of the integrator at a comparator of the sigma-delta ADC;
    receiving a plurality of dither signals at an input stage of the comparator, the dither signals configured to prevent limit cycles of the sigma-delta ADC; and
    providing a pulse train indicative of an analog level of the analog signal.

14. The method of claim 13, including:
    receiving the pulse train at a decimation filter; and
    providing a digital, multi-bit representation of the analog signal using an output of the decimation filter and the pulse train.

15. The method of claim 13, including resetting the integrator using an output of the comparator.

16. The method of claim 13, including generating the plurality of dither signals having a uniform amplitude distribution.

17. The method of claim 16, wherein generating the plurality of dither signals includes generating a single bit pattern having the uniform amplitude distribution at a controller of a dither generator; and
    propagating the single bit pattern using a plurality of series-coupled flip-flops, wherein an output of a first flip-flop of the plurality series-coupled flip-flops is configured to provide a first dither signal of the plurality of dither signals.

18. The method of claim 17, including receiving the plurality of dither signals at the controller.

* * * * *